United States Patent
Seibel, II et al.

(10) Patent No.: US 9,589,852 B2
(45) Date of Patent: Mar. 7, 2017

(54) ELECTROSTATIC PHOSPHOR COATING SYSTEMS AND METHODS FOR LIGHT EMITTING STRUCTURES AND PACKAGED LIGHT EMITTING DIODES INCLUDING PHOSPHOR COATING

(71) Applicant: Cree, Inc., Durham, NC (US)

(72) Inventors: Harry A. Seibel, II, Durham, NC (US); Brian Thomas Collins, Holly Springs, NC (US)

(73) Assignee: Cree, Inc., Durham, NC (US)

( * ) Notice: Subject to any disclaimer, the term of this patent is extended or adjusted under 35 U.S.C. 154(b) by 293 days.

(21) Appl. No.: 13/947,623

(22) Filed: Jul. 22, 2013

(65) Prior Publication Data

US 2015/0024516 A1    Jan. 22, 2015

(51) Int. Cl.
*H01L 21/67* (2006.01)
*H01L 21/66* (2006.01)
*H01L 33/00* (2010.01)

(52) U.S. Cl.
CPC .......... *H01L 22/10* (2013.01); *H01L 33/0095* (2013.01); *H01L 21/6715* (2013.01); *H01L 2933/0041* (2013.01)

(58) Field of Classification Search
CPC .............................................. H01L 2933/0041
USPC ............................................................ 438/7
See application file for complete search history.

(56) References Cited

U.S. PATENT DOCUMENTS

| 4,748,043 A * | 5/1988 | Seaver .................... B05B 5/002 118/630 |
| --- | --- | --- |
| 5,932,295 A * | 8/1999 | McMillan .............. B05D 1/007 257/E21.272 |
| 6,350,609 B1 * | 2/2002 | Morozov ............. B01J 19/0046 205/158 |
| 6,679,441 B1 * | 1/2004 | Borra .................... B05B 5/0255 239/690 |
| 6,924,233 B1 * | 8/2005 | Chua ....................... H01L 33/50 438/144 |
| 8,293,337 B2 * | 10/2012 | Bhatnagar ............. B05B 5/0255 427/466 |
| 8,853,678 B2 * | 10/2014 | Uchida ............... H01L 51/0003 257/40 |
| 2001/0017409 A1 * | 8/2001 | Hiroki ................ H01L 51/0005 257/723 |
| 2002/0187571 A1 * | 12/2002 | Collins, III ............ C25D 13/02 438/29 |
| 2003/0206332 A1 * | 11/2003 | Yamazaki ........... H01L 51/5253 359/312 |
| 2004/0209190 A1 * | 10/2004 | Mori et al. .................... 430/311 |
| 2005/0126480 A1 * | 6/2005 | Yamagata ............ B01J 19/0046 118/621 |
| 2005/0146551 A1 * | 7/2005 | Yamazaki ......... G02F 1/136286 347/20 |
| 2005/0181141 A1 * | 8/2005 | Flanagan ................ A61L 31/10 427/421.1 |

(Continued)

*Primary Examiner* — Eliseo Ramos Feliciano
*Assistant Examiner* — Ankush Singal
(74) *Attorney, Agent, or Firm* — Myers Bigel, P.A.

(57) ABSTRACT

Methods are disclosed including applying a layer of binder material onto an LED structure. A luminescent solution including an optical material suspended in a solution is atomized using a flow of pressurized gas, and the atomized luminescent solution is sprayed onto the LED structure including the layer of binder material using the flow of pressurized gas.

18 Claims, 9 Drawing Sheets

(56) References Cited

U.S. PATENT DOCUMENTS

| | | | |
|---|---|---|---|
| 2005/0224830 A1* | 10/2005 | Blonder | H01L 33/507 257/100 |
| 2007/0082499 A1* | 4/2007 | Jung | G03F 7/162 438/758 |
| 2007/0128745 A1* | 6/2007 | Brukilacchio | H01L 33/50 438/22 |
| 2007/0157880 A1* | 7/2007 | Tanioka | B05B 5/087 118/621 |
| 2007/0202258 A1* | 8/2007 | Yamagata | B01L 3/0268 427/282 |
| 2008/0173884 A1* | 7/2008 | Chitnis | H01L 33/44 257/98 |
| 2009/0179213 A1* | 7/2009 | Cannon | H01L 33/507 257/98 |
| 2010/0090216 A1* | 4/2010 | Ferrao De Paiva Martins | H01L 21/8252 257/43 |
| 2010/0155763 A1* | 6/2010 | Donofrio | H01L 33/50 257/98 |
| 2010/0173450 A1* | 7/2010 | Kimura et al. | 438/99 |
| 2011/0014542 A1* | 1/2011 | Sumida | D01D 5/0061 429/480 |
| 2011/0220920 A1* | 9/2011 | Collins | H01L 33/504 257/88 |
| 2012/0321818 A1* | 12/2012 | Umino | H01L 41/0805 427/585 |
| 2013/0020418 A1* | 1/2013 | Machi | C02F 1/48 239/690.1 |
| 2013/0153937 A1* | 6/2013 | Cho | H01L 27/1292 257/88 |
| 2015/0062250 A1* | 3/2015 | Byun | B05B 5/00 347/55 |

\* cited by examiner

ELECTROSTATIC PHOSPHOR COATING SYSTEMS AND METHODS FOR LIGHT EMITTING STRUCTURES AND PACKAGED LIGHT EMITTING DIODES INCLUDING PHOSPHOR COATING

BACKGROUND

This invention relates to coating of semiconductor devices. In particular, this invention relates to methods for spray-coating semiconductor light emission structures with layers of phosphor and/or other particles.

Light emitting diodes (LEDs) are semiconductor devices that convert electric energy to light. Inorganic LEDs typically include an active layer of semiconductor material and a P-N junction formed at an interface between two oppositely doped layers. When a bias is applied across the P-N junction, holes and/or electrons are injected by the P-N junction into the active layer. Recombination of holes and electrons in the active layer generates light that can be emitted from the LED. The structure of the device, and the material from which it is constructed, determine the intensity and wavelength of light emitted by the device. Recent advances in LED technology have resulted in highly efficient solid-state light sources that surpass the efficiency of incandescent and halogen light sources, providing light with equal or greater brightness in relation to input power.

Conventional LEDs generate narrow bandwidth, essentially monochromatic light. However, it is highly desirable to generate wide bandwidth, polychromatic light, such as white light, using a solid state light source. One way to produce white light from conventional LEDs is to combine different wavelengths of light from different LEDs. For example, white light can be produced by combining the light from red, green and blue emitting LEDs, or combining the light from blue and amber LEDs. This approach, however, requires the use of multiple LEDs to produce a single color of light, which can potentially increase the overall cost, size, complexity and/or heat generated by such a device. In addition, the different colors of light may also be generated from different types of LEDs fabricated from different material systems. Combining different LED types to form a white lamp can require costly fabrication techniques and can require complex control circuitry, since each device may have different electrical requirements and/or may behave differently under varied operating conditions (e.g. with temperature, current or time).

Light from a blue emitting LED has been converted to white light by surrounding the LED with a yellow phosphor, polymer or dye, such as cerium-doped yttrium aluminum garnet (Ce:YAG). The phosphor material absorbs and "downconverts" some of the blue light generated by the LED. That is, the phosphor material generates light, such as yellow light, in response to absorbing the blue light. Thus, some of the blue light generated by the LED appears to be converted to yellow light. Some of the blue light from the LED passes through the phosphor without being changed, however. The overall LED/phosphor structure emits both blue and yellow light, which combine to provide light that is perceived as white light.

LEDs have been combined with phosphor layers by dispensing a volume of phosphor-containing encapsulant material (e.g., epoxy resin or silicone) over the LED to cover the LED. In these methods, however, it can be difficult to control the geometry and/or thickness of the phosphor layer. As a result, light emitted from the LED at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Another conventional method for coating an LED is by stencil printing. In a stencil printing approach, multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the volumetric dispense method described above, the stenciling method may also present difficulties in controlling the geometry and/or layer thickness of the phosphor containing polymer. The stenciling composition may not fully fill the stencil opening, resulting in non-uniform layers. The phosphor-containing composition can also stick to the stencil opening, which may reduce the amount of composition remaining on the LED. These problems can result in LEDs having non-uniform color temperature and LEDs that are difficult to consistently reproduce with the same or similar emission characteristics.

Another conventional method for coating LEDs with a phosphor utilizes electrophoretic deposition (EPD). The conversion material particles are suspended in an electrolyte based solution. A plurality of LEDs are immersed in the electrolyte solution. One electrode from a power source is coupled to the LEDs, and the other electrode is arranged in the electrolyte solution. The bias from the power source is applied across the electrodes, which causes current to pass through the solution to the LEDs. This creates an electric field that causes the conversion material to be drawn to the LEDs, covering the LEDs with the conversion material.

After the LEDs are covered by the conversion material, they are removed from the electrolyte solution so that the LEDs and their conversion material can be covered by a protective resin. This adds an additional step to the process and the conversion material (phosphor particles) can be disturbed prior to the application of the epoxy. During the deposition process, the electric field in the electrolyte solution can also vary such that different concentrations of conversion material can be deposited across the LEDs. The conversion particles can also settle in the solution, which can also result in different conversion material concentrations across the LEDs. The electrolyte solution can be stirred to prevent settling, but this presents the danger of disturbing the particles already on the LEDs.

Still another coating method for LEDs utilizes droplet deposition using systems similar to those in an ink-jet printing apparatus. Droplets of a liquid phosphor-containing material are sprayed from a print head. The phosphor-containing droplets are ejected from a nozzle on the print head in response to pressure generated in the print head by a thermal bubble and/or by piezoelectric crystal vibrations. However, in order to control the flow of the phosphor-containing composition from the ink-jet print head, it may be necessary for the print head nozzle to be relatively small. In fact, it may be desirable to engineer the size and/or shape of the phosphor particles to prevent them from catching in the nozzle and clogging the print head.

SUMMARY

A method according to some embodiments includes biasing a luminescent solution including an optical material suspended in a solution at a first bias voltage level, mounting an LED structure on a stage, biasing the stage at a different voltage level than the first bias voltage level, atomizing the luminescent solution using a flow of pressurized gas, and spraying the atomized luminescent solution onto the LED structure using the flow of pressurized gas. Spraying the luminescent solution may include spraying the luminescent solution with an air pressurized spray system.

The method may further include applying a layer of binder material to the LED structure before spraying the atomized luminescent solution onto the LED structure. Applying the layer of binder material may include spraying the binder material with an air pressurized spray system.

The luminescent solution may include wavelength conversion particles suspended in a volatile solvent, and the method may further include evaporating a solvent from the luminescent solution to provide a layer of wavelength conversion particles on the LED structure.

The method may further include curing the nonvolatile solvent to provide a layer including the wavelength conversion particles on the LED structure.

The LED structure may include an LED chip having a top surface and a wirebond pad on the top surface, and the method may further include bonding a wire to the wirebond pad before spraying the luminescent solution onto the LED chip.

The LED structure may include an LED wafer, and the method may further include singulating the LED wafer into a plurality of LED chips after evaporating the solvent from the luminescent solution.

Evaporating the solvent from the luminescent solution may include baking the luminescent solution and/or exposing the luminescent solution to ultraviolet light.

The method may further include energizing the LED structure to cause the LED structure to emit light, testing the optical characteristics if the LED structure, and if the optical characteristics of the LED structure are not within a predetermined binning threshold, spraying additional luminescent solution including a phosphor suspended in a solution onto the LED structure, evaporating the additional luminescent solution to provide an additional layer of phosphor on the LED structure, and applying an additional layer of binder material onto the LED structure.

The LED structure may include an LED chip having a top surface and a wirebond pad on the top surface, and the method may further include mounting the LED within an optical cavity of an LED package before spraying the luminescent solution onto the LED chip.

The method may further include dispensing an encapsulant material into the optical cavity over the LED chip, thereby covering the LED chip including the layer of phosphor with the encapsulant material.

The LED structure may include an LED wafer, the method may further include forming a plurality of electrical contacts on a surface of the LED wafer, and forming a plurality of sacrificial patterns on respective ones of the plurality of electrical contacts. Applying the layer of binder material may include applying the layer of binder material to the sacrificial patterns and onto exposed surfaces of the LED wafer between the sacrificial patterns.

The method may further include removing the sacrificial patterns and the portion of the binder material on the sacrificial patterns to expose the plurality of electrical contacts.

The sacrificial patterns may not completely cover top surfaces of the electrical contacts, so that the applied binder material is at least partially on portions of the top surfaces of the electrical contacts.

A deposition system according to some embodiments includes a liquid supply line, a reservoir coupled to the liquid supply line and configured to supply a liquid solvent containing particles of optical material to the liquid supply line, a first voltage bias unit configured to charge the liquid solvent and the particles of optical material with an electrical charge, a spray nozzle coupled to the liquid supply line and configured to receive the charged liquid solvent and particles of optical material from the liquid supply line, a gas line coupled to the spray head and configured to provide a pressurized gas to the spray nozzle, a controller configured to control a flow of the charged liquid solvent into the spray nozzle, a conductive stage positioned to provide a target for atomized particles of the charged optical material emitted by the spray nozzle, and a second voltage bias unit configured to charge the conductive stage at a voltage that is different from the charged optical material.

The deposition system may further include an optical sensor configured to detect light output by an LED structure. The controller may be configured to control the flow of the liquid solvent into the spray nozzle in response to the detected light output.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Figure 1A:
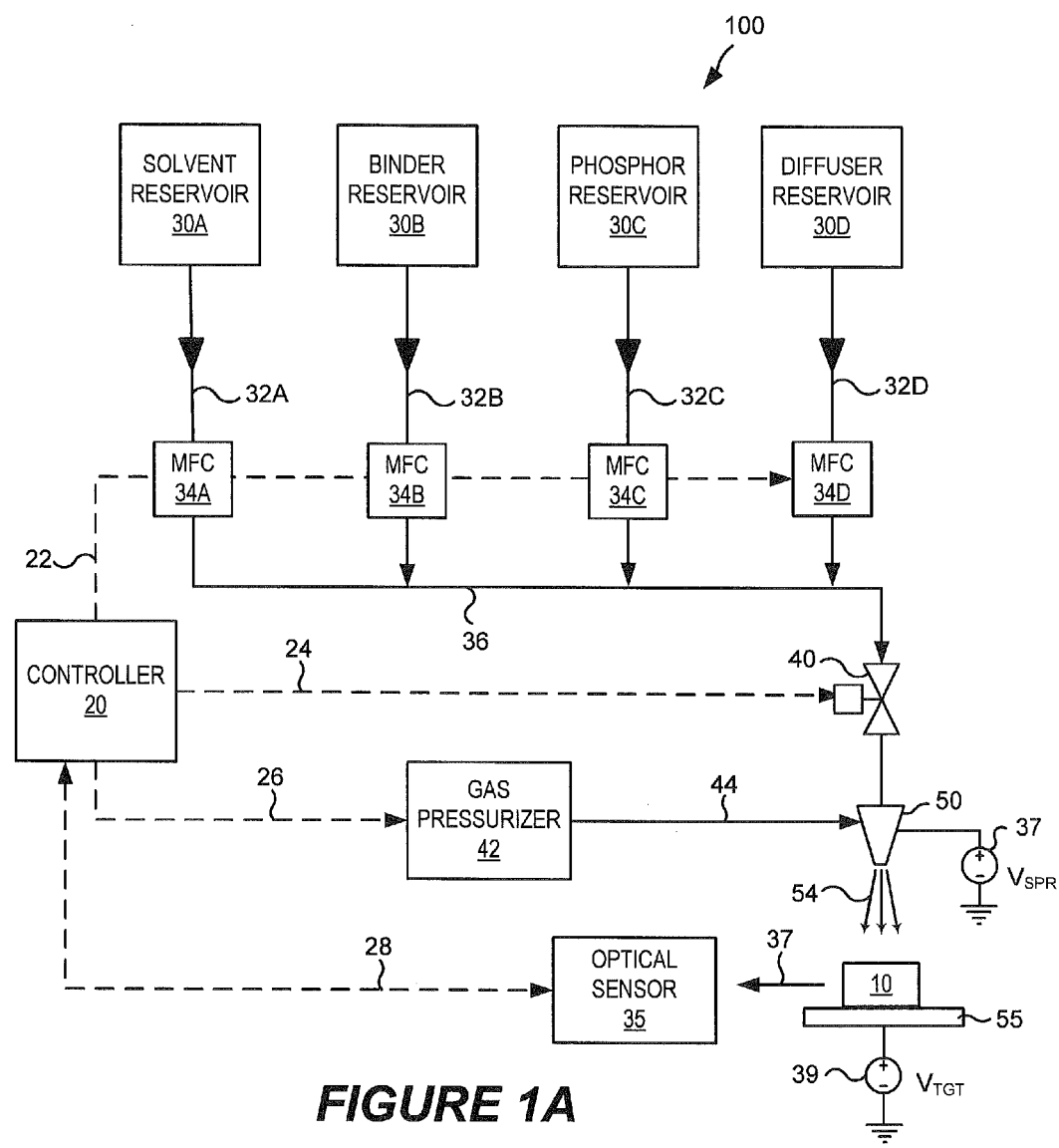
FIGS. 1A to 1C are schematic diagrams illustrating deposition systems for coating a light emitting diode (LED) structure with optical materials, according to some embodiments of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIG. 1A is a schematic diagram illustrating a pressurized deposition system 100 for coating a light emitting diode (LED) structure 10 with optical materials, such as luminescent particles and/or diffuser particles. According to some embodiments, the optical materials are sprayed onto the LED structure 10 by the system 100. As shown in FIG. 1A, a supply line 36 supplies a carrier liquid containing the optical materials to a spray nozzle 50. The carrier liquid is sprayed onto an LED structure 10 that is mounted on a stage 55 via the spray nozzle 50. In particular, pressurized gas supplied to the spray nozzle 50 through a high pressure gas supply line 44 atomizes the carrier liquid and directs the atomized liquid including the optical materials towards the LED structure 10 where the optical materials are deposited, as described in more detail below. (As noted above, the term "atomize" is used herein in a general sense to refer to reducing a liquid to minute particles or to a fine spray.) The LED structure 10 can include an LED wafer, a mounted LED die, an unmounted (i.e. bare) LED die, a panel of LED packages including exposed LED chips, a panel of leadframes on which LED chips are mounted, or other structures. Accordingly, systems and methods according to embodiments of the invention can be used at various stages of a manufacturing process.

The liquid in the supply line 36 can include, for example, a binder material, such as liquid silicone and/or liquid epoxy, and/or a volatile solvent material, such as alcohol, water, acetone, methanol, ethanol, ketone, isopropanol, hydrocarbon solvents, hexane, ethylene glycol, methyl ethyl ketone, and combinations thereof. In general, a volatile solvent dries or evaporates off shortly after being deposited. A volatile or nonvolatile solvent material can include particles therein that are to be deposited onto the LED structure, such as particles of a luminescent material (e.g. a phosphor) and/or particles of a light-scattering material, such as titanium dioxide. The liquid in the supply line 36 is provided from one of a plurality of fluid reservoirs 30A to 30D, which are attached to the supply line 36 through respective input lines 32A to 32D. The flow of liquid through the input lines 32A to 32D can be carefully controlled by electronically-controlled mass flow controllers 34A to 34D, respectively.

As shown in FIG. 1A, the reservoirs 30A to 30D can include a solvent reservoir 30A that contains a volatile liquid solvent, such as alcohol, water, etc., and a binder reservoir 30B that contains a liquid binder material, such as liquid silicone and/or liquid epoxy. In some embodiments, the solvent reservoir 30A and the binder reservoir 30B can include "pure" liquids, that is, liquids that do not contain any phosphor, diffuser, or other particles therein. The reservoirs 30A to 30D can also include a phosphor reservoir 30C that contains a liquid solvent in which a concentration of phosphor particles is suspended. In some embodiments, the phosphor reservoir 30C can include phosphor particles at a concentration that is greater than a concentration at which the phosphor particles will be applied onto the LED structure 10.

The reservoirs 30A to 30D can also include a diffuser reservoir 30D that contains a liquid solvent in which a concentration of diffuser particles is suspended. In some embodiments, the diffuser reservoir 30D can include diffuser particles at a concentration that is greater than a concentration at which the diffuser particles will be applied onto the LED structure 10.

One or more of the reservoirs 30A to 30D can be pressurized, so that flow from the reservoirs 30A to 30D can be obtained by positive pressure into the supply line 36. In particular, the solvent reservoir 30A and the binder reservoir 30B can be pressurized. In some embodiments, the phosphor reservoir 30C and/or the diffuser reservoir 30D may not be pressurized, so that flow from the phosphor reservoir 30C and/or the diffuser reservoir 30D may be induced into the supply line 36 by negative pressure caused by flow through the supply line 36. The pressure in the liquid supply line 36 need not be high, since the force for spraying the liquid onto the LED structure 10 is provided by a high-pressure gas line 44.

The flow of liquid through the supply line 36 can be controlled by an electronically controllable valve 40. When the valve 40 is open, liquid in the supply line 36 is supplied to the spray nozzle 50.

Figure 1B:
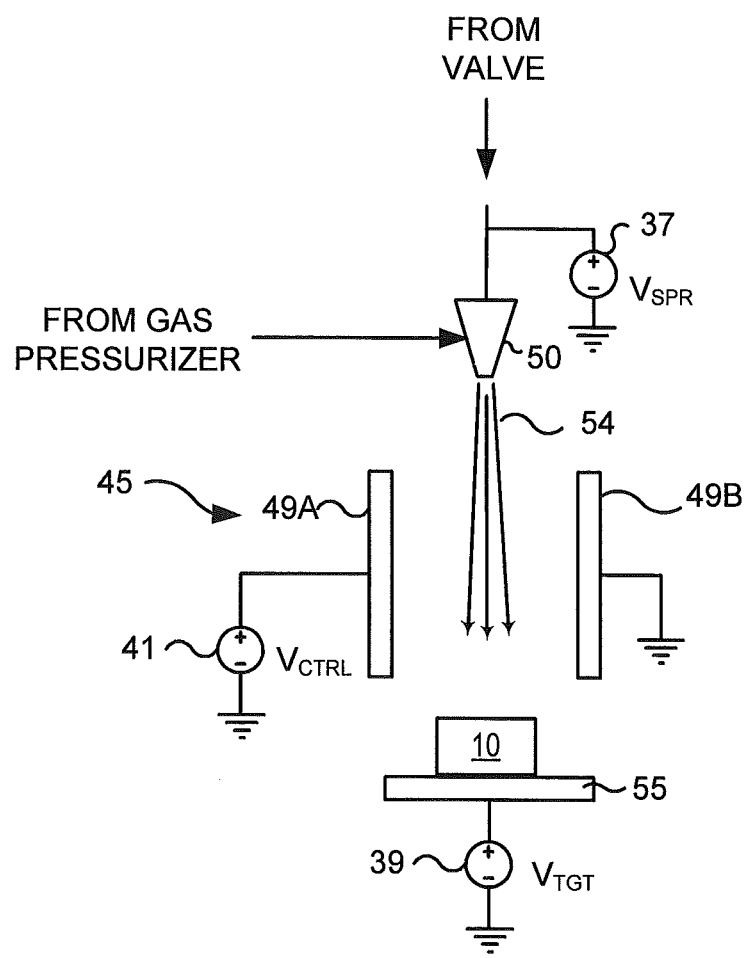
Figure 1C:
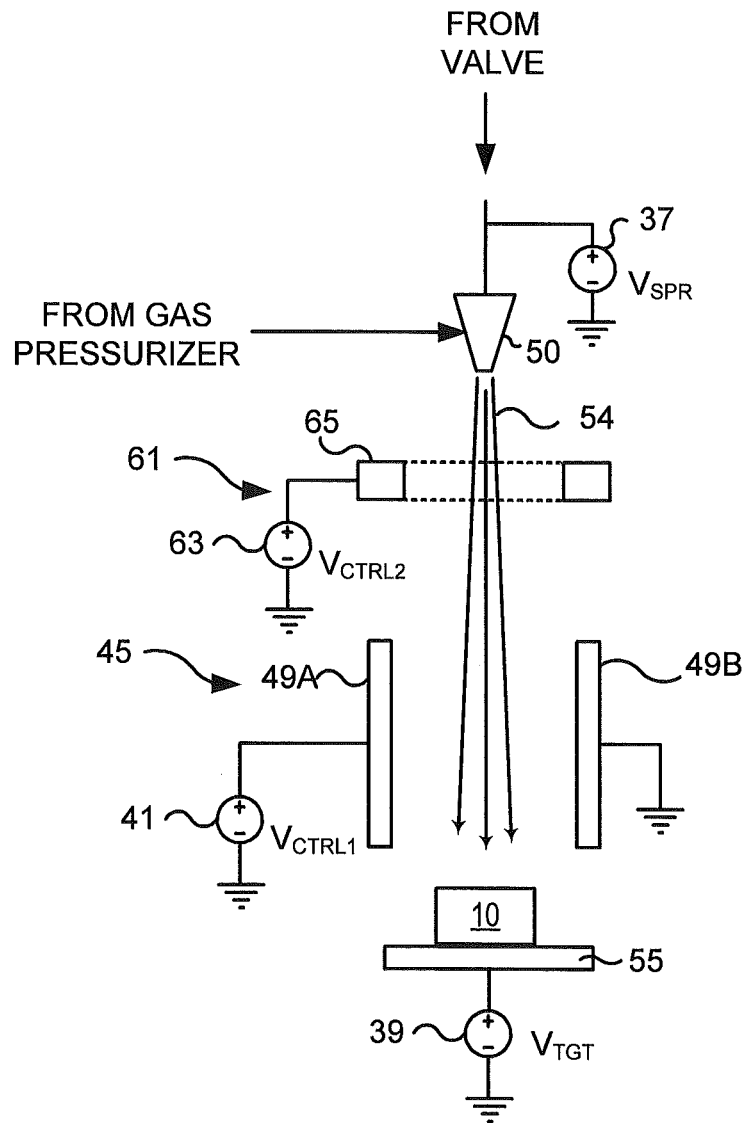
Figure 2:
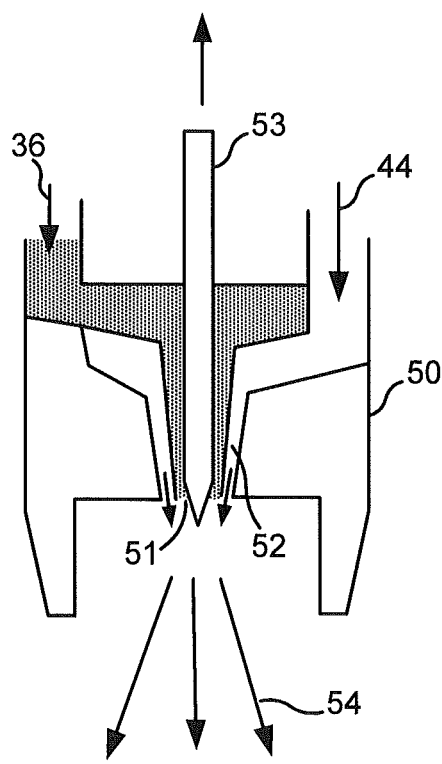
FIG. 2 illustrates a spray nozzle according to embodiments of the invention.
Figure 3:
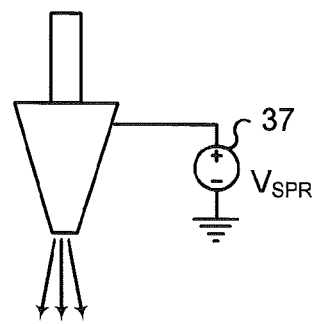
FIGS. 3, 4 and 5 illustrate the application of optical materials to LED chips according to further embodiments.
Figure 3:
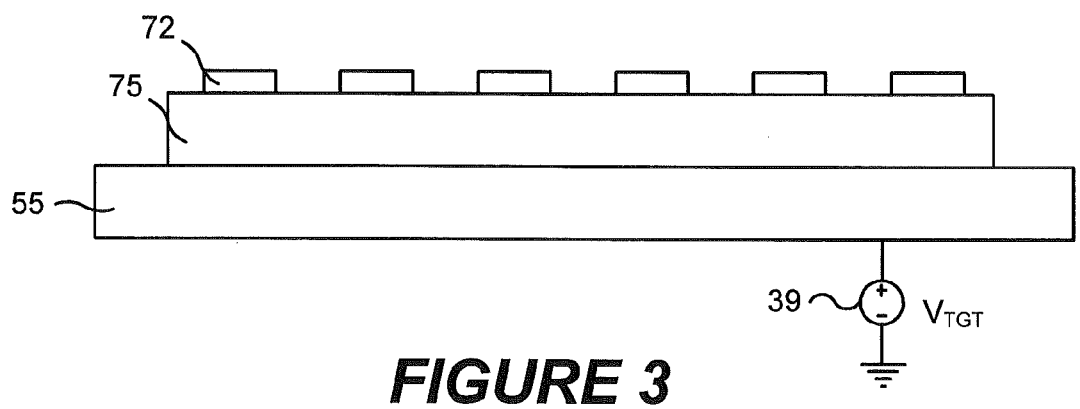
Figure 4:
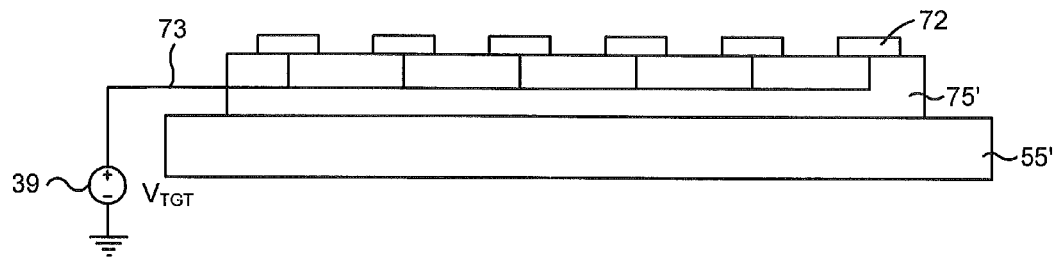
Figure 5:
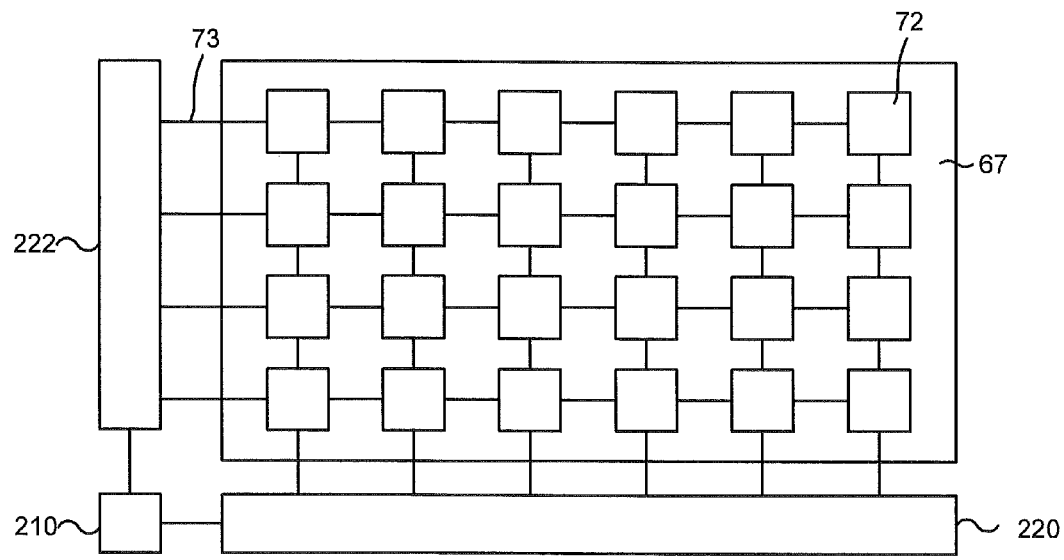

FIG. 2 illustrates a spray nozzle 50 according to embodiments of the invention in greater detail. Referring to FIGS. 1 and 2, pressurized gas (e.g., pressurized air) generated by a gas pressurizer 42 is supplied to the spray nozzle 50 through the pressurized gas supply line 44. The pressurized gas is directed to through a gas outlet port 52 in the spray nozzle 50 that is adjacent a liquid outlet port 51. The flow of liquid through the liquid outlet port 51 can be regulated, for example, by controlling the position of a retractable pin 53. When the pin 53 is retracted, the liquid outlet port 51 is opened. The flow of pressurized gas out of the gas outlet port 52 creates a negative pressure gradient relative to the liquid outlet port 51, which causes liquid dispensed from the liquid outlet port 51 to be atomized. The atomized liquid 54 is then carried by the gas flow from the gas outlet port 52 to the LED structure 10, where the atomized liquid 54 flow deposits on the LED structure.

As further illustrated in FIG. 1A, operations of the mass flow controllers 34A to 34D, the electronically controllable flow valve 40, and the gas pressurizer 42 can be controlled by a controller 20 via electronic control lines 22, 24, 26. The controller 20 can be a conventional programmable controller and/or can include an application specific integrated circuit (ASIC) configured to control operation of the respective elements of the system 100, or a general microprocessor or controller (e.g. computer).

Referring still to FIG. 1A, by controlling the operations of the mass flow controllers (MFCs) 34A to 34D and the valve 40, the controller 20 can control the composition of liquid that is supplied to the spray nozzle 50 through the supply line 36. In particular, the controller 20 can cause the MFCs 30A, 30C and 30D to turn off, while the MFC 30B and the valve 40 are turned on, to thereby supply the binder liquid to the spray nozzle 50. Likewise, the controller 20 can cause the MFCs 30B, 30C and 30D to turn off, while the MFC 30A and the valve 40 are turned on, to thereby supply only the solvent liquid to the spray nozzle 50. With the solvent material from the solvent reservoir 30A flowing, the controller 20 can cause the MFCs 34C and/or 34D to release liquids bearing phosphor particles (in the case of the phosphor reservoir 30C) and/or diffuser particles (in the case of the diffuser reservoir 30D) into the flow in the supply line 36. Accordingly, the controller 20 can precisely control the composition of material sprayed onto the LED structure 10 by the spray nozzle 50.

It will be appreciated that while FIG. 1A illustrates a single phosphor reservoir 30C and a single diffuser reservoir 30D, more reservoirs can be provided and attached to the supply line through respective MFCs and/or supply valves that can be electronically controlled by the controller 20. For example, separate phosphor reservoirs can be provided for red phosphors, green phosphors, yellow phosphors, blue phosphors, etc., depending on the product requirements. Furthermore, more than one type of diffuser particle can be selectively provided using different diffuser reservoirs. For example, it may be desirable to apply diffuser particles having a first composition and/or diameter on one part of an LED structure 10 and diffuser particles having a different composition and/or diameter on another part of the LED structure 10.

It will be further appreciated that a system 100 as illustrated in FIG. 1A may be split into several parts, so that, for example, separate supply lines 36 are provided and/or separate spray nozzles 50 are provided. For example, a system could have one supply line 36 and nozzle 50 dedicated to spray-applying a binder material, and a separate supply line 36 and nozzle 50 dedicated to spray-applying phosphor-bearing liquids and/or diffuser-bearing liquids. Accordingly, many different combinations of reservoirs, supply lines and spray nozzles are contemplated according to various embodiments.

As further illustrated in FIG. 1A, the liquid solvent including the phosphor particles may be biased at a first bias voltage VSPR by a first bias voltage unit 37. The level of the first bias voltage VSPR may be controlled by the controller 20. Accordingly, the atomized spray 54 emitted by the nozzle 50 may comprise charged particles of the phosphor material.

Furthermore, the stage 55 may comprise a conductive material, and may be charged by a second voltage bias unit 39 at a second bias voltage VTGT that is different from the first bias voltage VSPR. The level of the second bias voltage VTGT may also be controlled by the controller 20. In particular, the second bias voltage VTGT may have an opposite polarity from the first bias voltage VSPR, or may have a ground (neutral) voltage level. In some embodiments, the first bias voltage level VSPR may be a positive voltage level so that the particles of phosphor material in the atomized spray have a positive voltage, and the second bias voltage level VTGT may be a negative voltage, so that the positively charged particles of phosphor are attracted to the stage 55. In other embodiments, the first bias voltage level VSPR may be a negative voltage level so that the particles of phosphor material in the atomized spray have a negative voltage, and the second bias voltage level VTGT may be a positive voltage.

In either case, the atomized spray, and in particular the charged phosphor particles in the atomized spray 54, may be attracted to the stage 55. Thus, the atomized spray may be directed by an electric field towards the stage 55, reducing the amount of spray material that is wasted by being sprayed outside the area of the stage 55. Moreover, the LED structure 10 may be conductively connected to the stage 55 so that it obtains the same charge as the stage 55. The charged phosphor particles in the atomized spray 54 may also be attracted to the LED structure 10.

By charging the phosphor particles in the atomized spray 54, it may be possible to apply the phosphor particles more uniformly to the LED structure, which may result in a more stable, repeatable process with less waste and/or tighter control of device yield with less variation in light output from device to device. The phosphor particles may be applied in uniform, well controlled layers with reduced overspray.

Referring to FIG. 1B, the direction of the atomized spray may be altered by a beam directing unit 45. The beam directing unit 45 may include first and second conductive plates 45A, 45B placed on opposite sides of the conductive spray 54. A voltage level of the first conductive plate 45A may be set by a third voltage bias unit 41 to a voltage level VCTRL1 responsive to a signal from the controller 20. The second conductive plate 45B may be grounded. Depending on the voltage level of the first conductive plate 45A, the particles in the atomized spray 54 may be deflected toward or away from the first conductive plate 45A. A second pair of conductive plates (not shown) and a fifth voltage bias unit may be provided to deflect the conductive spray 54 in an orthogonal direction, thereby providing two-dimensional control over the direction of the conductive spray.

Referring to FIG. 1C, the charged atomized spray can also be controlled by a focusing unit 61 that is positioned between the nozzle 50 and the stage 55.

The focusing unit 35 may include a conductive ring 65 that surrounds the atomized spray 54. A fourth voltage bias unit 63 sets a voltage level of the conductive ring 35A to a voltage level VCTRL2 responsive to a control signal from the controller 20. Depending on the voltage level of the conductive ring 35, the particles in the atomized spray 54 may be attracted to or repelled from the conductive ring 35, causing the radius of the atomized spray 54 to become larger or smaller.

FIG. 1A further illustrates an optical sensor 35 that is configured to sense light 37 emitted by the LED structure 10. For example, the optical sensor 35 can detect a color point and/or intensity of light emitted by the LED structure 10. The detected light information can be provided to the controller 30 via a communication line 28, and can be used as a feedback signal in the control of the operations of the deposition system 100, as described in more detail below.

Referring to FIG. 3, a plurality of light emitting elements 72, which may include LED chips, LED packages, leadframes on which LEDs are mounted, etc., may be mounted on a substrate or submount 75, which may be a conductive material. The submount 75 is mounted on the stage 55 so that the voltage VTGT applied to the stage 55 is applied to the entire submount 75 and to each of the light emitting elements 72.

Referring to FIG. 4, the stage 55' and/or the submount 75' may be formed of insulating materials, and the voltage VTGT may be applied to the light emitting elements 72 by conducting lines 73 that may be formed in/on the stage 55' and/or the submount 75'. When only the light emitting elements 72 are biased by the voltage VTGT, the particles in the conductive spray 54 may be selectively attracted only to the light emitting elements 72, further reducing waste and/or improving uniformity of application.

Referring to FIG. 5, in some embodiments the light emitting elements may be connected by conductive lines 73 in a matrix, and the bias voltage VTGT may be selectively applied to individual ones of the light emitting elements 72 through row and column selectors 220, 222 coupled to a bias control unit 210 that generates the bias voltage VTGT and applies it to a light emitting element at a selected row and column location. Such an arrangement may provide additional control over the application of phosphor material to a light emitting element.

Referring now to FIGS. 6A to 6D, application of optical materials to an LED structure is illustrated. In the embodiments of FIGS. 6A to 6D, the optical materials are applied to an LED chip or die 70 mounted on a substrate 60. However, as explained above, optical materials may be applied in a similar manner to bare (i.e. unmounted) LED die and/or to LED wafers. An LED wafer includes a wafer substrate on which thin epitaxial layers forming an LED active layer have been formed and/or mounted. Accordingly, an LED wafer can include a growth substrate on which the epitaxial layers have been grown and/or a carrier substrate to which the epitaxial layers have been transferred.

As shown in FIG. 6A, an LED chip 70 is mounted on a substrate 60. The LED chip 70 can be mounted on the substrate 60 through an intermediary structure, such as a bonding pad and/or submount (not shown). In some embodiments, The LED chip 70 can be mounted in an optical cavity 64 defined by a reflector cup 62 that is placed on the substrate 60. The reflector cup 62 includes an angled reflective surface 66 facing the LED chip 70 and configured to reflect light emitted by the LED chip 70 away from the optical cavity 64. The reflector cup 62 further includes upwardly extending sidewalls 62A that define a channel for receiving and holding a lens 94 (FIG. 6D).

It will be appreciated that the reflector cup 62 is optional. For example, the LED chip 70 could be mounted on a substrate 60, printed circuit board or other support member without any reflector around the LED chip 70. Moreover, the reflector cup 62 and the substrate 60 could be merged together as a unitary structure. The substrate 60 could also include a leadframe, and a package body may be formed on the leadframe surrounding the LED chip 70 and defining the optical cavity 64. Accordingly, the LED chip 70 could be mounted in many different styles of packaging, and the present invention is not limited to the particular packaging configuration shown in the Figures.

Still referring to FIG. 6A, the LED chip 70 can include a wirebond pad 72, and a wirebond connection 74 can be formed from the wirebond pad 72 to a corresponding contact pad (not shown) on the substrate 60 or elsewhere. However, it will be appreciated that the LED chip 70 could be a horizontal LED chip having both anode and cathode contacts on the same side of the chip, and could be mounted in flip-chip fashion on the substrate 60, so that no bond wire connections may be made to the LED chip in some embodiments.

Referring to FIGS. 1A, 2 and 6A, the controller 20 of the pressurized deposition system 100 can cause a liquid binder material 80 to be supplied to the spray nozzle 50 through the supply line 36. For example, the controller 20 can open the MFC 34B and the valve 40 and close the MFCs 34A, 34C and 34D. Any remaining phosphor-bearing solvents in the supply line 36 can be purged prior to deposition of the binder material.

The liquid binder material 80 is sprayed onto the LED chip 70, forming a thin layer of binder material 80 thereon. The binder material may be formed to have a thickness of less than about 1000 μm, and in some embodiments, may have a thickness less than 1 μm. As noted above, the liquid binder material can include a material such as silicone and/or epoxy.

Referring to FIGS. 1A, 2, and 6B, after application of the binder material 80, the supply line 36 can again be purged, and a liquid solvent can be supplied to the supply line 36 by opening the MFC 34A. A desired concentration of optical materials, such as phosphor particles and/or diffuser particles can be provided into the supply line 36 by controlling the MFCs 34C, 34D. The liquid solvent may in some embodiments include a volatile liquid solvent, such as alcohol and/or any of the volatile solvents listed above. The liquid solvent including the optical materials is sprayed onto the LED chip 70, forming a thin coating 90 (e.g., less than 1000 μm, and in some embodiments, less than 1 μm) on the binder material 80.

The volatile solvent liquid may then be evaporated off, leaving the optical materials (e.g., phosphor particles and/or diffuser particles) stuck to the binder material 80. After evaporation of the solvent, the remaining layer of phosphor particles can have a thickness of about 1 μm to about 1000 μm. Accordingly, in some embodiments, a layer of phosphor materials can be substantially thinner than the layer of binder material. However, in some cases, a non-volatile solvent, such as silicone and/or epoxy resin, may be used as a carrier liquid for the phosphor/diffuser particles, in which case the non-volatile solvent may be cured to form a layer 90 of optical material over the LED chip 70.

Figure 6A:
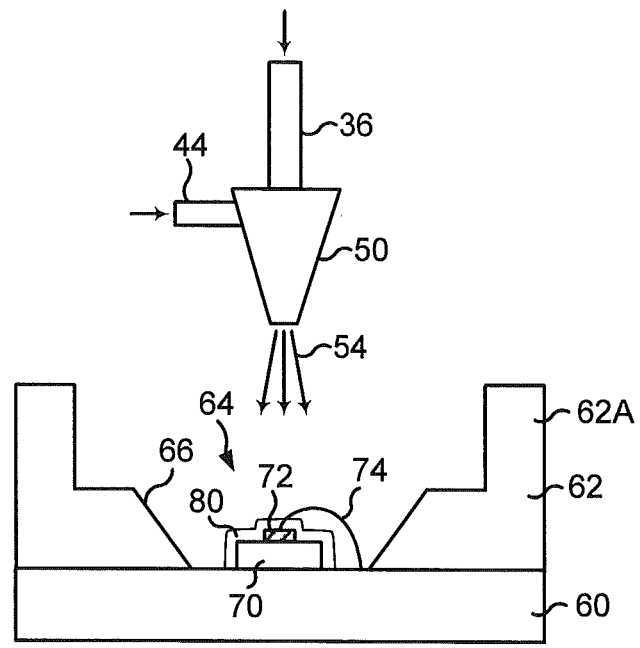
FIGS. 6A, 6B, 6C and 6D illustrate the application of optical materials to a mounted LED chip according to some embodiments.
Figure 6B:
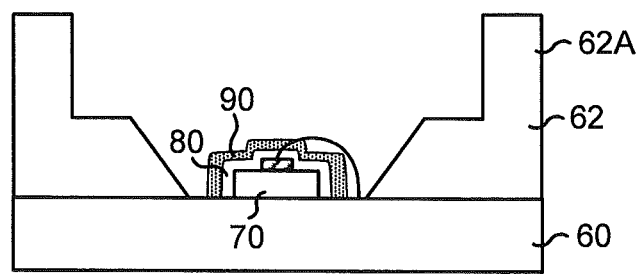
Figure 6C:
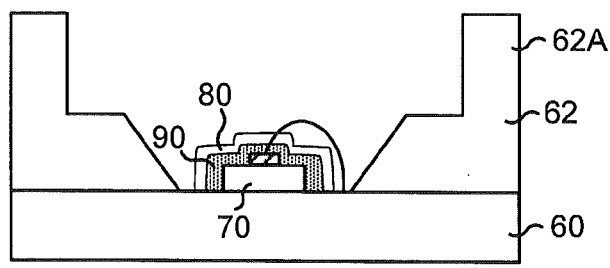

As shown in FIG. 6C, the layer 90 of optical material may be formed on the LED chip 70 first, and then the layer 80 of binder material can be formed over the layer 90 of optical material. The layer 90 of optical material may be formed by spraying the liquid solvent including the optical materials therein onto the LED chip 70 and then evaporating/curing the solvent before applying the layer 80 of binder material over the layer 90.

Figure 6D:
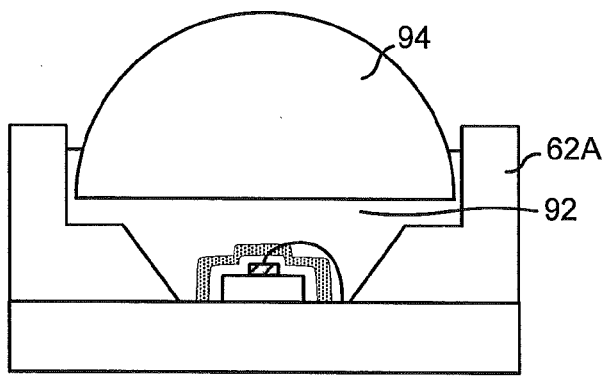

Referring to FIG. 6D, after spray-coating the LED chip 70 with the layers 80, 90 of binder and phosphor material, an encapsulant material 92, such as silicone and/or epoxy, can be dispensed to at least partially fill the optical cavity 64, and a lens 94, such as a glass or silicone lens, can be positioned over the LED chip 70. Curing the encapsulant material 92 secures the lens 94 to the structure, while the vertical wall portions 62A of the reflector cup 62 allow the lens to travel as the encapsulant material 92 expands and contracts with heating/cooling cycles.

Figure 7:
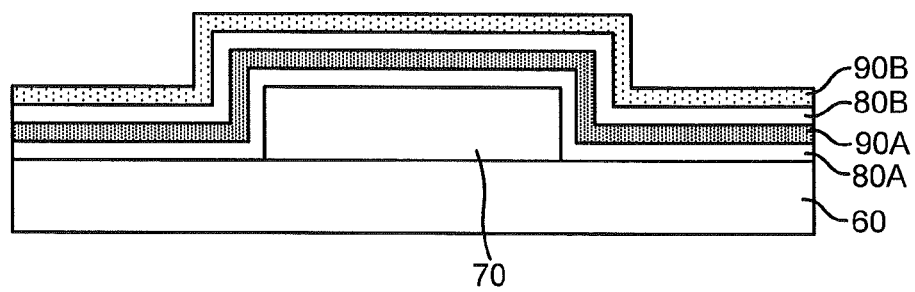
FIG. 7 illustrate the application of optical materials to an LED chip according to some embodiments.

In some embodiments, spray-coating of binder material layers and optical material layers can be alternated. For example, referring to FIG. 7, a layer 80A of binder material may be coated onto an LED chip 70 on a submount 60. A layer 90A of optical material, such as phosphor particles and/or diffuser particles, can be formed on the layer 80A in the manner described above. A second layer 80B of binder material can then be applied onto the layer 90A of an optical material, and a second layer 90B of optical material can be applied onto the second layer 80B of binder material. In some embodiments, the second layer 80B of binder material can be omitted from between the first layer 90A and the second layer 90B of phosphor material.

The first layer 90A and second layer 90B of optical materials can include the same or different optical materials. For example, the first layer 90A of optical material can include phosphor particles, while the second layer 90A of optical material can include diffuser particles, or vice-versa. In some embodiments, the first layer 90A of optical material can include phosphor particles configured to convert incident light to a first wavelength (e.g. yellow), while the second layer 90A of optical material can include phosphor particles configured to convert incident light to a second wavelength, different from the first wavelength (e.g. red). Accordingly, light output by the packaged LED chip 70 can be a mixture of primary light emitted by the LED chip 70 and secondary light emitted by the first layer 90A of phosphor and the second layer 90B of phosphor. Such light can have improved color rendering properties compared to light generated using only one kind of phosphor.

Figure 8:
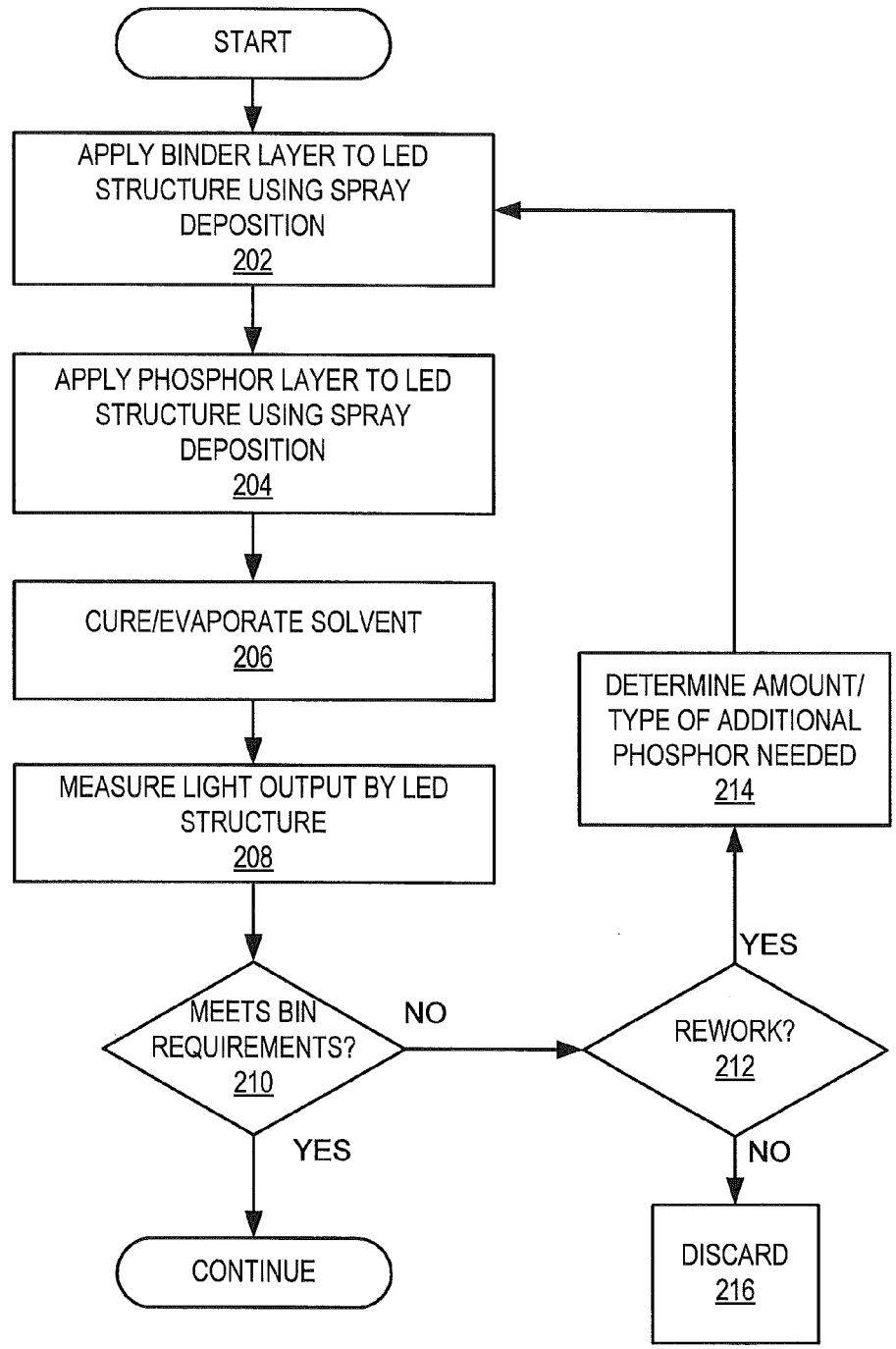
FIG. 8 is a flowchart illustrating operations according to some embodiments of the invention.

In some embodiments, the first layer of optical material 90A and the second layer of optical material 90B can include the same type of phosphor. For example, referring to FIGS. 1A, 7 and 8, a first binder layer 80A can be applied to an LED structure, such as an LED chip 70 (Block 202) using a spray deposition system 100 according to embodiments of the invention. A first phosphor layer 90A can then be applied to the binder layer by spray-coating a phosphor-bearing solvent (Block 204). The solvent can then be evaporated and/or cured, depending on whether the solvent is volatile or non-volatile, and the binder material can be cured to adhere the phosphor particles to the LED chip 70 (Block 206). At this point, the LED structure could be stored, e.g. at room temperature, to be later retrieved for further tuning.

The LED structure can then be energized, for example, by applying a voltage across anode and cathode terminals of the device, and the optical characteristics (e.g., power output, color point, CCT) of the device including the first phosphor layer 80A can be measured. In particular, the output power (brightness), color point and/or correlated color temperature (CCT) of the LED structure can be measured (Block 208). For example, the light output by the LED structure can be measured by an optical sensor 35, and the results can be provided to the controller 20. Testing the LED structure may be easiest when the LED structure includes a mounted LED chip. When the LED structure includes an LED wafer, it may be possible to test representative areas/devices on the wafer instead of testing every device on the wafer, and tune the entire wafer based on the light output from the test locations.

A test is then performed to determine if the optical characteristics of the wafer are acceptable, i.e. to see if the wafer meets established binning requirements (Block 210). If the optical characteristics of the structure are unacceptable, a decision is made at Block 212 whether to discard the device (Block 216) or rework the device. However, if the optical characteristics are satisfactory, the manufacturing process proceeds to the next manufacturing step.

If it is determined that the device can be reworked, the light output from the LED structure can be tuned by determining the amount and type of additional phosphor needed to correct the color point/CCT of the structure (Block 214). A second binder layer 80B can be applied (Block 202) and/or the first binder layer can be reheated so that it again becomes tacky, and a second phosphor layer 90B of the same or different type from the phosphor used in the first phosphor layer 90A can be applied using the spray deposition system 100 under the direction of the controller 20.

In general, the operations of blocks 202-214 can be repeated as desired to achieve the desired optical characteristics. However, if too much phosphor is applied, the light emission characteristics may deteriorate due to reabsorption and/or excessive absorption of light from the LED structure, at which point the LED structure may fail the test at Block 210.

The solvent liquid carrying the binder material can be evaporated/cured after each coating layer of optical material is applied. Furthermore the liquid binder material can be fully and/or partially cured after each coating layer of binder material is applied and/or after the solvent liquid applied thereto is evaporated/cured.

In the drawings and specification, there have been disclosed typical embodiments of the invention and, although specific terms are employed, they are used in a generic and descriptive sense only and not for purposes of limitation, the scope of the invention being set forth in the following claims

What is claimed is:

1. A method, comprising:
   biasing a luminescent solution comprising an optical material suspended in a solution at a first bias voltage level;
   mounting an LED structure on a stage;
   biasing the stage at a different voltage level than the first bias voltage level;
   atomizing the biased luminescent solution using a flow of pressurized gas; and
   spraying the atomized biased luminescent solution onto the LED structure using the flow of pressurized gas.

2. The method of claim 1, further comprising applying a layer of binder material to the LED structure before spraying the atomized biased luminescent solution onto the LED structure.

3. The method of claim 1 wherein the luminescent solution comprises wavelength conversion particles suspended in a volatile solvent, the method further comprising evaporating a solvent from the luminescent solution to provide a layer of wavelength conversion particles on the LED structure.

4. The method of claim 1, wherein the luminescent solution comprises wavelength conversion particles suspended in a nonvolatile solvent, the method further comprising curing the nonvolatile solvent to provide a layer including the wavelength conversion particles on the LED structure.

5. The method of claim 1, wherein the LED structure comprises an LED chip having a top surface and a wirebond pad on the top surface, the method further comprising bonding a wire to the wirebond pad before spraying the atomized biased luminescent solution onto the LED chip.

6. The method of claim 1, wherein the LED structure comprises an LED wafer, the method further comprising singulating the LED wafer into a plurality of LED chips after evaporating the solvent from the luminescent solution.

7. The method of claim 1, further comprising:
energizing the LED structure to cause the LED structure to emit light;
testing the optical characteristics of the LED structure; and
if the optical characteristics of the LED structure are not within a predetermined binning threshold, spraying additional luminescent solution comprising a phosphor suspended in a solution onto the LED structure, evaporating the additional luminescent solution to provide an additional layer of phosphor on the LED structure, and applying an additional layer of binder material onto the LED structure.

8. The method of claim 1, wherein the LED structure comprises an LED chip having a top surface and a wirebond pad on the top surface, the method further comprising mounting the LED within an optical cavity of an LED package before spraying the atomized biased luminescent solution onto the LED chip.

9. The method of claim 8, further comprising:
dispensing an encapsulant material into the optical cavity over the LED chip, thereby covering the LED chip including the layer of phosphor with the encapsulant material.

10. The method of claim 2, wherein the LED structure comprises an LED wafer, the method further comprising:
forming a plurality of electrical contacts on a surface of the LED wafer; and
forming a plurality of sacrificial patterns on respective ones of the plurality of electrical contacts;
wherein applying the layer of binder material comprises applying the layer of binder material to the sacrificial patterns and onto exposed surfaces of the LED wafer between the sacrificial patterns.

11. The method of claim 10, wherein the sacrificial patterns do not completely cover top surfaces of the electrical contacts, so that the applied binder material is at least partially on portions of the top surfaces of the electrical contacts.

12. The method of claim 1, wherein the atomized biased luminescent solution is sprayed onto the LED structure using a spray nozzle, wherein the beam directing unit includes a first conductive member that is biased to a first voltage level that is on one side of the spray of the atomized biased luminescent solution and a second conductive member that is biased to a second voltage level that is on another side of the spray of the atomized biased luminescent solution, and wherein the beam directing unit further includes a third conductive member and a fourth conductive member that may be biased to provide two dimensional control over the direction of the spray of the atomized biased luminescent solution.

13. The method of claim 1, further comprising using a focusing unit to adjust a radius of the spray of the atomized biased luminescent solution.

14. The method of claim 13, wherein the focusing unit comprises a conductive ring, and wherein the radius of the spray of the atomized biased luminescent solution is controlled by controlling a voltage level of the conductive ring.

15. The method of claim 1, wherein the stage includes a plurality of LED structures, and wherein the first bias voltage is only applied to a subset of the LEDs on the stage.

16. The method of claim 15, wherein the first bias voltage is selectively applied to the stage through row and column selectors.

17. A deposition system, comprising:
a liquid supply line;
a reservoir coupled to the liquid supply line and configured to supply a liquid solvent containing particles of optical material to the liquid supply line;
a first voltage bias unit configured to charge the liquid solvent and the particles of optical material at a voltage that has a first polarity;
a spray nozzle coupled to the liquid supply line and configured to receive the charged liquid solvent and particles of optical material from the liquid supply line;
a gas line coupled to the spray nozzle and configured to provide a pressurized gas to the spray nozzle;
a controller configured to control a flow of the charged liquid solvent into the spray nozzle;
a conductive stage positioned to provide a target for atomized particles of the charged optical material emitted by the spray nozzle; and
a second voltage bias unit configured to charge the conductive stage at a voltage that has a second polarity that is opposite the first polarity.

18. A method, comprising:
electrically biasing a luminescent solution comprising an optical material suspended in a solution at a first bias voltage level that has a first polarity;
mounting an LED structure on a stage;
biasing the stage at a different voltage level that has a second polarity that is opposite the first polarity;
flowing the electrically biased luminescent solution to a spray nozzle; and
spraying the electrically biased luminescent solution through the spray nozzle onto the LED structure using a flow of pressurized gas.

* * * * *